(12) United States Patent
Wei et al.

(10) Patent No.: US 11,588,138 B2
(45) Date of Patent: Feb. 21, 2023

(54) DISPLAY DEVICE AND MANUFACTURING METHOD THEREOF, ELECTRONIC DEVICE

(71) Applicant: BOE TECHNOLOGY GROUP CO., LTD., Beijing (CN)

(72) Inventors: Junbo Wei, Beijing (CN); Shengji Yang, Beijing (CN); Kuanta Huang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 251 days.

(21) Appl. No.: 16/959,623

(22) PCT Filed: Aug. 16, 2019

(86) PCT No.: PCT/CN2019/101120
§ 371 (c)(1),
(2) Date: Jul. 1, 2020

(87) PCT Pub. No.: WO2021/030971
PCT Pub. Date: Feb. 25, 2021

(65) Prior Publication Data
US 2021/0408435 A1    Dec. 30, 2021

(51) Int. Cl.
*H01L 51/52* (2006.01)
*H01L 25/18* (2006.01)
(Continued)

(52) U.S. Cl.
CPC ............ *H01L 51/529* (2013.01); *H01L 25/18* (2013.01); *H01L 51/56* (2013.01); *H01L 24/29* (2013.01);
(Continued)

(58) Field of Classification Search
None
See application file for complete search history.

(56) References Cited

U.S. PATENT DOCUMENTS

2007/0035473 A1* 2/2007 Yamazaki ........... G02F 1/13452
345/4
2015/0249231 A1* 9/2015 Yaginuma ............... H01L 51/56
257/40
(Continued)

FOREIGN PATENT DOCUMENTS

| CN | 105338792 A | 2/2016 |
| CN | 105657967 A | 6/2016 |

(Continued)

*Primary Examiner* — Michelle Mandala
*Assistant Examiner* — Jordan M Klein

(57) ABSTRACT

A display device, an electronic device and a manufacturing method of a display device are disclosed. The display device includes a silicon-based organic light-emitting display panel, a heat dissipation film layer, and a flexible circuit board. The silicon-based organic light-emitting display panel includes a silicon substrate, a first electrode of a display component, an organic light-emitting layer, and a second electrode of the display component, which are stacked sequentially; the heat dissipation film layer is at a non-display side of the silicon-based organic light-emitting display panel; the flexible circuit board is at least partially at a side of the heat dissipation film layer away from the silicon-based organic light-emitting display panel; and the flexible circuit board is configured to transmit electrical signals to a gate drive circuit, a data drive circuit, and the second electrode of the display component.

18 Claims, 8 Drawing Sheets

(51) Int. Cl.
*H01L 51/56* (2006.01)
*H01L 23/00* (2006.01)
*H01L 27/32* (2006.01)
*H01L 51/00* (2006.01)

(52) U.S. Cl.
CPC ............ *H01L 24/32* (2013.01); *H01L 27/326* (2013.01); *H01L 51/0096* (2013.01); *H01L 2224/2919* (2013.01); *H01L 2224/32225* (2013.01); *H01L 2924/0782* (2013.01)

(56) References Cited

U.S. PATENT DOCUMENTS

| | | | |
|---|---|---|---|
| 2016/0315129 A1* | 10/2016 | Hack | H01L 27/3244 |
| 2019/0012007 A1* | 1/2019 | Kim | H01L 27/3234 |
| 2019/0373719 A1* | 12/2019 | Lee | H01L 51/5237 |
| 2020/0022261 A1* | 1/2020 | Choi | H04M 1/0266 |
| 2020/0058712 A1* | 2/2020 | Lee | H01L 27/323 |
| 2020/0089368 A1* | 3/2020 | Shim | H01L 27/3276 |

FOREIGN PATENT DOCUMENTS

| | | | | |
|---|---|---|---|---|
| CN | 205303466 U | | 6/2016 | |
| CN | 206907770 U | | 1/2018 | |
| CN | 108102568 A | * | 6/2018 | ............... C08K 3/08 |
| CN | 108109521 A | | 6/2018 | |
| CN | 207690416 U | | 8/2018 | |
| CN | 109493748 A | | 3/2019 | |
| JP | 2014048643 A | | 3/2014 | |

* cited by examiner

DISPLAY DEVICE AND MANUFACTURING METHOD THEREOF, ELECTRONIC DEVICE

TECHNICAL FIELD

Embodiments of the present disclosure relate to a display device, an electronic device, and a manufacturing method of a display device.

BACKGROUND

Micro organic light-emitting diode (Micro-OLED) display device is a new OLED display device which adopts a silicon substrate as a base substrate, and Micro-OLED display device is also referred to as silicon-based organic light-emitting diode (silicon-based OLED) display device. The silicon-based OLED display device has the advantages, such as small size and high resolution. The silicon-based OLED display device is formed by mature integrated circuit CMOS technology, and realizes the active addressing of pixels. The silicon-based OLED display device comprises a plurality kinds of circuits, such as a TCON (control board or logic board), an OCP (operation control panel), etc., and can be lightweight.

SUMMARY

At least one embodiment of the present disclosure provides a display device, which comprises: a silicon-based organic light-emitting display panel, a heat dissipation film layer, and a flexible circuit board. The silicon-based organic light-emitting display panel comprises a silicon substrate, a first electrode of a display component, an organic light-emitting layer, and a second electrode of the display component, which are stacked sequentially; the heat dissipation film layer is at a non-display side of the silicon-based organic light-emitting display panel; the flexible circuit board is at least partially at a side of the heat dissipation film layer away from the silicon-based organic light-emitting display panel, and is electrically connected to the silicon-based organic light-emitting display panel; the silicon substrate is integrated with a gate drive circuit, a data drive circuit, and a pixel circuit, and the flexible circuit board is configured to transmit electrical signals to the gate drive circuit, the data drive circuit, and the second electrode of the display component.

For example, in the display device provided by at least one embodiment of the present disclosure, the flexible circuit board is provided with at least one through-hole, and an orthographic projection of the least one through-hole on a plane parallel to the silicon-based organic light-emitting display panel at least partially overlaps an orthographic projection of the heat dissipation film layer on the plane parallel to the silicon-based organic light-emitting display panel.

For example, in the display device provided by at least one embodiment of the present disclosure, the orthographic projection of the least one through-hole on the plane parallel to the silicon-based organic light-emitting display panel is within the orthographic projection of the heat dissipation film layer on the plane parallel to the silicon-based organic light-emitting display panel.

For example, in the display device provided by at least one embodiment of the present disclosure, the silicon substrate comprises a display area and a periphery area which surrounds the display area, and the display component is in the display area; and the flexible circuit board is connected to the periphery area of the silicon substrate, and is bended along an edge of the silicon substrate, so as to allow at least part of the flexible circuit board is at the side of the heat dissipation film layer away from the silicon-based organic light-emitting display panel.

For example, in the display device provided by at least one embodiment of the present disclosure, an orthographic projection of the heat dissipation film layer on a plane parallel to the silicon-based organic light-emitting display panel at least partially overlaps an orthographic projection of the display area on the plane parallel to the silicon-based organic light-emitting display panel; and the orthographic projection of the heat dissipation film layer on the plane parallel to the silicon-based organic light-emitting display panel is within an orthographic projection of the silicon substrate on the plane parallel to the silicon-based organic light-emitting display panel.

For example, in the display device provided by at least one embodiment of the present disclosure, an orthographic projection of the heat dissipation film layer on a plane parallel to the silicon-based organic light-emitting display panel is within an orthographic projection of the silicon-based organic light-emitting display panel on the plane parallel to the silicon-based organic light-emitting display panel.

For example, in the display device provided by at least one embodiment of the present disclosure, the heat dissipation film layer comprises: a first adhesive film layer and a first heat dissipation film layer. The first adhesive film layer is adhered onto the flexible circuit board; the first heat dissipation film layer is between the first adhesive film layer and the silicon substrate.

For example, in the display device provided by at least one embodiment of the present disclosure, the heat dissipation film layer further comprises: a second heat dissipation film layer between the first heat dissipation film layer and the silicon substrate.

For example, in the display device provided by at least one embodiment of the present disclosure, a material of the second heat dissipation film layer comprises graphite or graphene.

For example, in the display device provided by at least one embodiment of the present disclosure, the heat dissipation film layer further comprises: a second adhesive film layer which is at a side of the first heat dissipation film layer closer to the silicon substrate, and is adhered onto the silicon-based organic light-emitting display panel.

For example, in the display device provided by at least one embodiment of the present disclosure, a material of the first adhesive film layer and a material of the second adhesive film layer comprise an acrylic pressure-sensitive film.

For example, in the display device provided by at least one embodiment of the present disclosure, a material of the first heat dissipation film layer is a metal.

For example, in the display device provided by at least one embodiment of the present disclosure, the metal comprises copper, copper alloy, silver, silver alloy, aluminum or aluminum alloy.

For example, in the display device provided by at least one embodiment of the present disclosure, the silicon-based organic light-emitting display panel further comprises: a first film encapsulation layer, a second film encapsulation layer, a color film layer and a cover plate. The first film encapsulation layer and the second film encapsulation layer are sequentially provided at a side of the second electrode of the display component away from the organic light-emitting layer; the color film layer between the first film encapsulation layer and the second film encapsulation layer; and the cover plate at a side of the second film encapsulation layer away from the color film layer.

For example, the display device provided by at least one embodiment of the present disclosure further comprises a drive circuit. The drive circuit is connected to the flexible circuit board, and is configured to provide drive signals to the silicon-based organic light-emitting display panel.

At least one embodiment of the present disclosure further provides an electronic device, which comprises a display device provided by any one of embodiments of the present disclosure. The electronic device is a virtual reality device or an augmented reality device.

At least one embodiment of the present disclosure further provides a manufacturing method of a display device, which comprises: providing a silicon-based organic light-emitting display panel; forming a heat dissipation film layer at a non-display side of the silicon-based organic light-emitting display panel; and connecting a flexible circuit board to the silicon-based organic light-emitting display panel, and allowing at least part of the flexible circuit board to be at a side of the heat dissipation film layer away from the silicon-based organic light-emitting display panel.

For example, the manufacturing method of the display device provided by at least one embodiment of the present disclosure, further comprises: forming at least one through-hole in the flexible circuit board, wherein an orthographic projection of the least one through-hole on a plane parallel to the silicon-based organic light-emitting display panel at least partially overlaps an orthographic projection of the heat dissipation film layer on the plane parallel to the silicon-based organic light-emitting display panel.

For example, in the manufacturing method of the display device provided by at least one embodiment of the present disclosure, connecting the flexible circuit board to the silicon-based organic light-emitting display panel, and allowing at least part of the flexible circuit board to be at the side of the heat dissipation film layer away from the silicon-based organic light-emitting display panel comprises: connecting the flexible circuit board to a display side of the silicon-based organic light-emitting display panel, and bending the flexible circuit board along an edge of the silicon-based organic light-emitting display panel, so as to allow at least part of the flexible circuit board to be at the side of the heat dissipation film layer away from the silicon-based organic light-emitting display panel.

For example, in the manufacturing method of the display device provided by at least one embodiment of the present disclosure, forming the heat dissipation film layer at the non-display side of the silicon-based organic light-emitting display panel, comprises: forming a first adhesive film layer; forming a first heat dissipation film layer on the first adhesive film layer by an evaporation process; and forming a second heat dissipation film layer on the first heat dissipation film layer by an evaporation process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
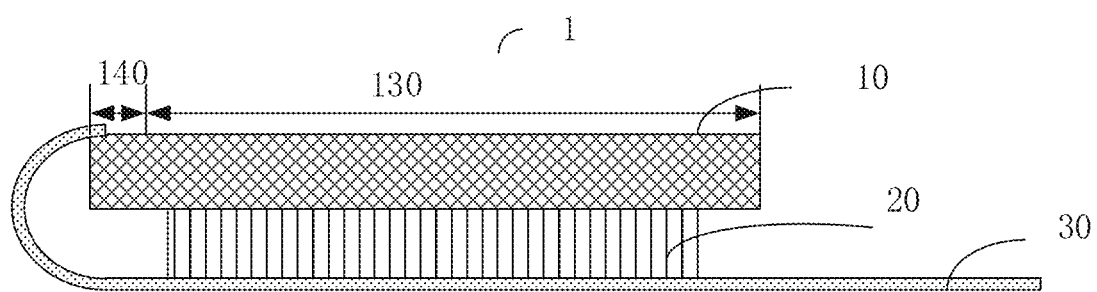
FIG. 1 is a cross-sectional view of a display device provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, silicon-based OLED display devices are widely used in near eye display fields, such as virtual reality (VR) or augmented reality (AR), especially in AR/VR head mounted display devices. When the silicon-based OLED display devices are used in the near eye display device, the heat dissipation of the display devices is very important because the temperature of the display devices directly determines the user's experience.

On the one hand, the current silicon-based OLED display device does not have a specific heat dissipation design scheme, and the heat dissipation is achieved only by setting a heat conduction interface and connecting the heat conduction interface to the complete machine. However, the above heat dissipation scheme is only suitable for the heat dissipation of a head mounted display, and not suitable for the heat dissipation of an individual display device. On the other hand, the silicon-based OLED display device may generate a lot of heat when the silicon-based OLED display device runs for a long time, that is, a light-emitting layer of the silicon-based OLED display device may generate a lot of heat in the process of light-emitting, which enables the temperature of the silicon-based OLED display device rise. Because the temperature change of the silicon-based OLED display device may cause the display brightness of the silicon-based OLED display device to change, this can cause problems, such as the display non-uniformity and the reduction of lifetime, to present in the display device, such that the display quality is affected.

To solve the above problems, at least one embodiment of the present disclosure provides a display device, and the display device comprises a silicon-based organic light-emitting display panel, a heat dissipation film layer, and a flexible circuit board. The silicon-based organic light-emitting display panel comprises a silicon substrate, a first electrode of a display component, an organic light-emitting layer, and a second electrode of the display component, which are stacked sequentially; the heat dissipation film layer is at a non-display side of the silicon-based organic light-emitting display panel; the flexible circuit board is at least partially at a side of the heat dissipation film layer away from the silicon-based organic light-emitting display panel, and is electrically connected to the silicon-based organic light-emitting display panel; the silicon substrate is integrated with a gate drive circuit, a data drive circuit, and a pixel circuit, and the flexible circuit board is configured to transmit electrical signals to the gate drive circuit, the data drive circuit, and the second electrode of the display component.

Some embodiments of the present disclosure further provide an electronic device and a manufacturing method of a display device which are corresponding to the above display device.

For the display device provided in the above embodiments of the present disclosure, on the one hand, the display device realizes the heat dissipation of the silicon-based organic light-emitting display panel through adopting the heat dissipation film layer, such that the adverse effect of the temperature change of the silicon-based organic light-emitting diode in the silicon-based organic light-emitting display panel caused by the heat dissipation issue on the display brightness and display life time of the display device is avoided, the display quality of the display device is improved, and the service life of the display device is prolonged. On the other hand, the display device allows the heat dissipation film layer to be integrated with the silicon-based OLED display substrate, this allows the manufacturing process to be simple, improves the compactness of the display device, and significantly reduces the manufacturing cost of the display device.

Embodiments of the present disclosure and examples thereof will be described in detail below in connection with the accompanying drawings.

At least one embodiment of the present disclosure provides a display device, for example, the display device is a silicon-based OLED display device, which can be applied in a virtual reality device or an augmented reality display device, obviously, the display device may be a display device of other types, and no limitation will be given in embodiments of the present disclosure in this respect.

Figure 2:
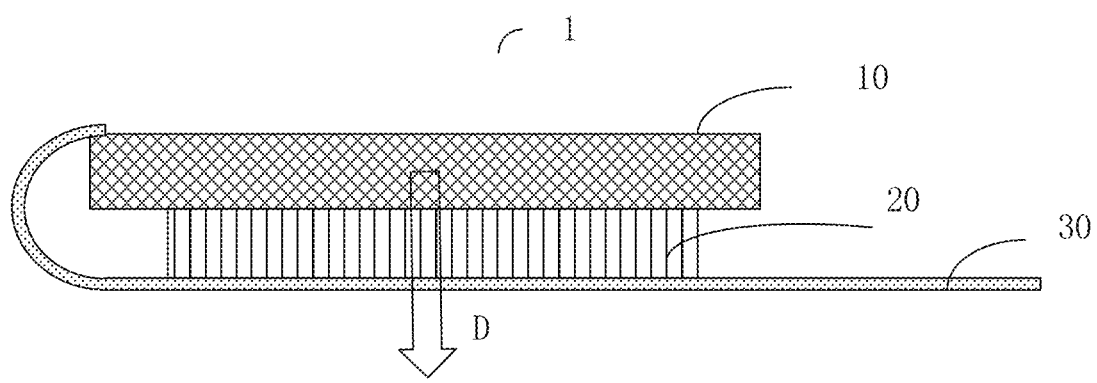
FIG. 2 is a schematic diagram illustrating heat dissipation of a display device provided by at least one embodiment of the present disclosure.

FIG. 1 is a cross-sectional view of a display device provided by at least one embodiment of the present disclosure, and FIG. 2 is schematic diagram illustrating heat dissipation of a display device provided by at least one embodiment of the present disclosure. The display device provided by at least one embodiment of the present disclosure is described in detail with reference to FIG. 1 and FIG. 2 in the following.

As illustrated in FIG. 1, the display device 1 comprises: a silicon-based organic light-emitting display panel 10, a heat dissipation film layer 20, and a flexible circuit board (FPC) 30. For example, the heat dissipation film layer 20 is at a non-display side of the silicon-based organic light-emitting display panel 10 (a lower side of the silicon-based organic light-emitting display panel 10 as illustrated in FIG. 1). The flexible circuit board 30 is at least partially at a side of the heat dissipation film layer 20 away from the silicon-based organic light-emitting display panel 10 (a lower side of the heat dissipation film layer 20 as illustrated in FIG. 1), and is electrically connected to the silicon-based organic light-emitting display panel 10, so as to provide drive signals to the silicon-based organic light-emitting display panel 10 to drive the silicon-based organic light-emitting display panel to emit light. For example, the drive signals here may comprise at least one of a data signal and a power signal.

For example, in some examples, an orthographic projection of the heat dissipation film layer 20 on a plane parallel to the silicon-based organic light-emitting display panel 10 is within an orthographic projection of the silicon-based organic light-emitting display panel 10 on the plane parallel to the silicon-based organic light-emitting display panel, for example, a position of the heat dissipation film layer 20 is corresponding to the silicon-based organic light-emitting display panel 10, and the heat dissipation film layer 20 is integrated or attached under the silicon-based organic light-emitting display panel 10, such that effective heat dissipation of the silicon-based organic light-emitting display panel 10 can be realized. For example, a size of the heat dissipation film layer 20 is slightly smaller than a size of the silicon-based organic light-emitting display panel 10, such that adversely effect of the heat dissipation film layer 20 with a larger size on the size of the display device 1 and limitation on application scenario of the display device 1 can be avoided. In embodiments of the present disclosure, a volume of the heat dissipation film layer 20 is small, the heat dissipation effect is good, the service life of a silicon-based OLED display component can be prolonged, and the optical performance of high quality display can be achieved.

Figure 6A:
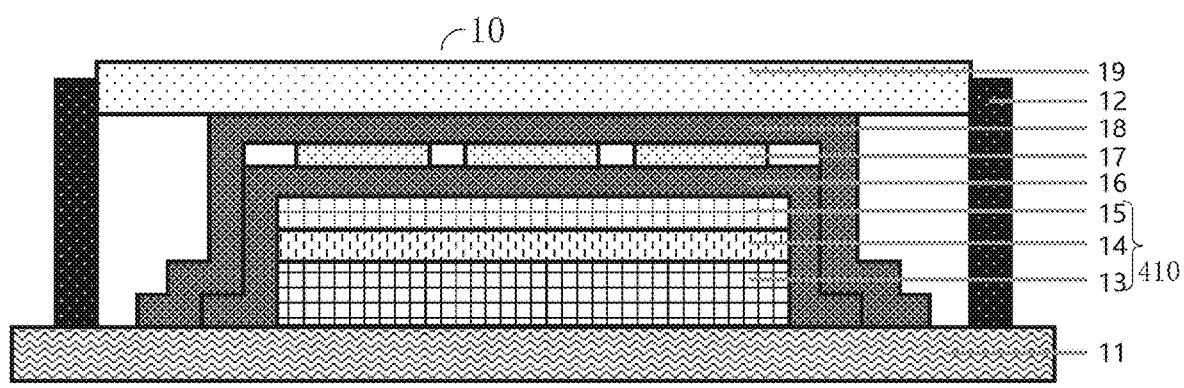
FIG. 6A is schematic diagram of a silicon-based organic light-emitting display panel provided by at least one embodiment of the present disclosure.
Figure 6B:
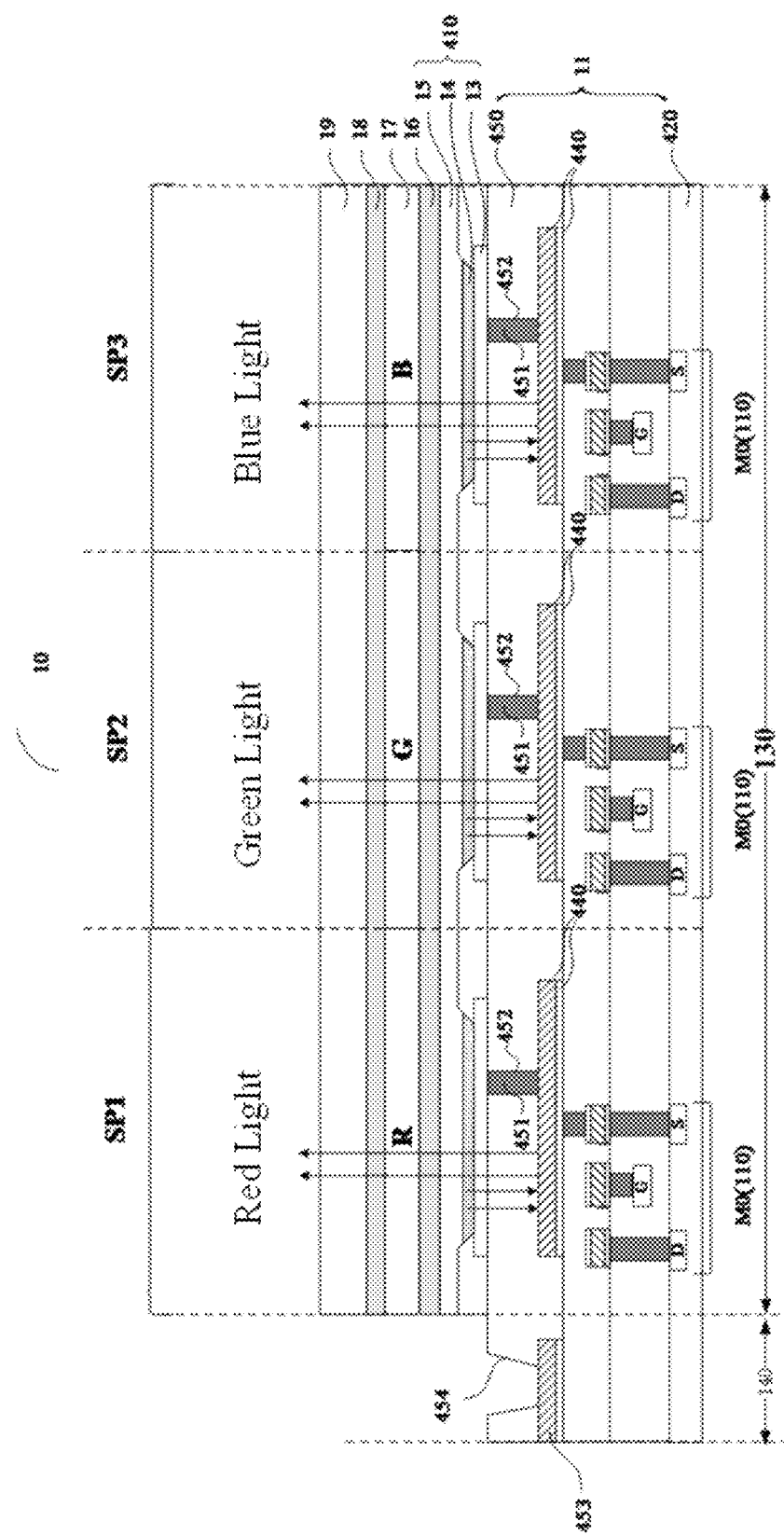
FIG. 6B is a cross-sectional view of part of a silicon-based organic light-emitting display panel provided by at least one embodiment of the present disclosure.
Figure 6C:
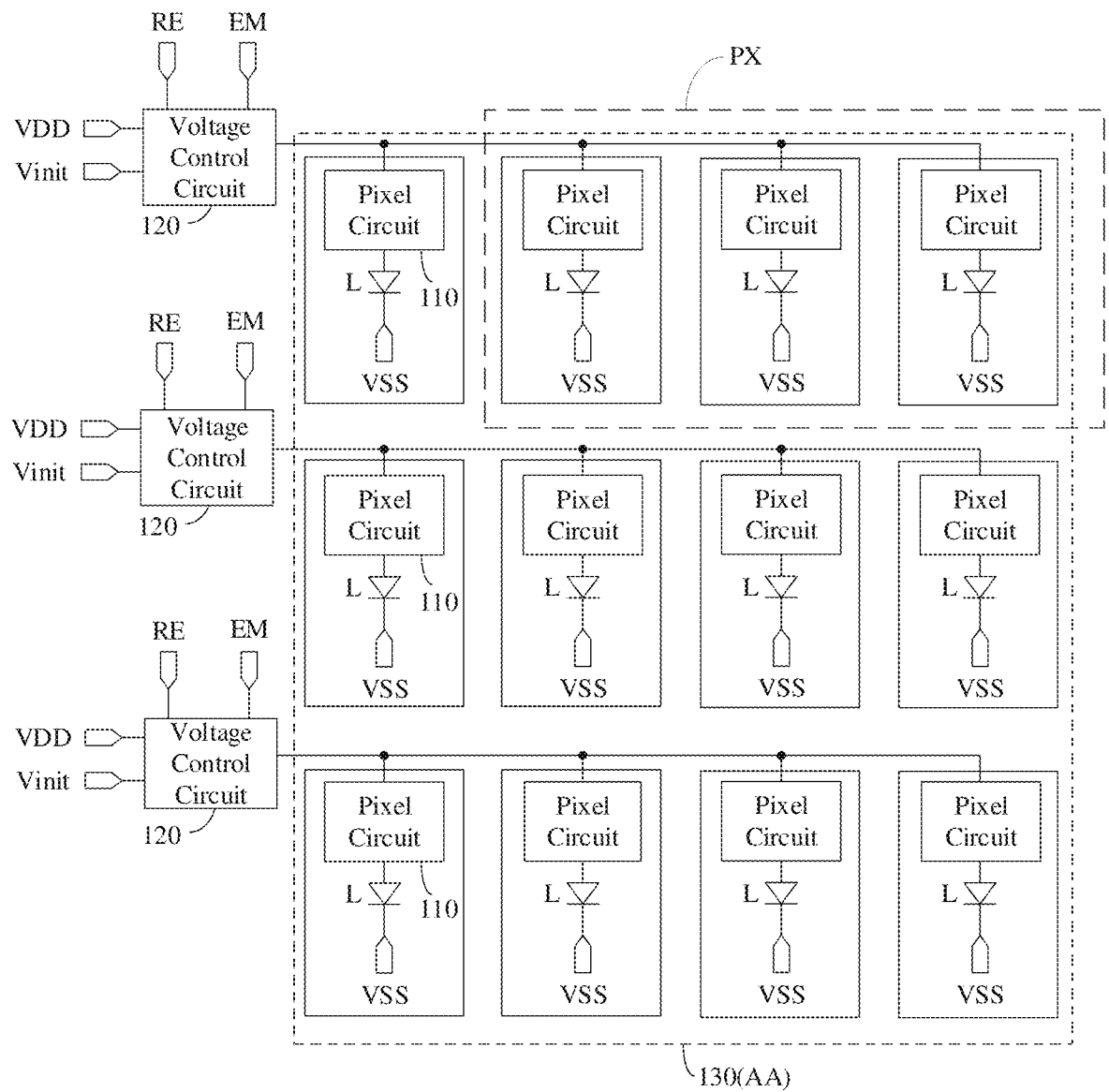
FIG. 6C is a schematic diagram illustrating circuit principle of a silicon-based organic light-emitting display panel provided by at least one embodiment of the present disclosure.
Figure 6D:
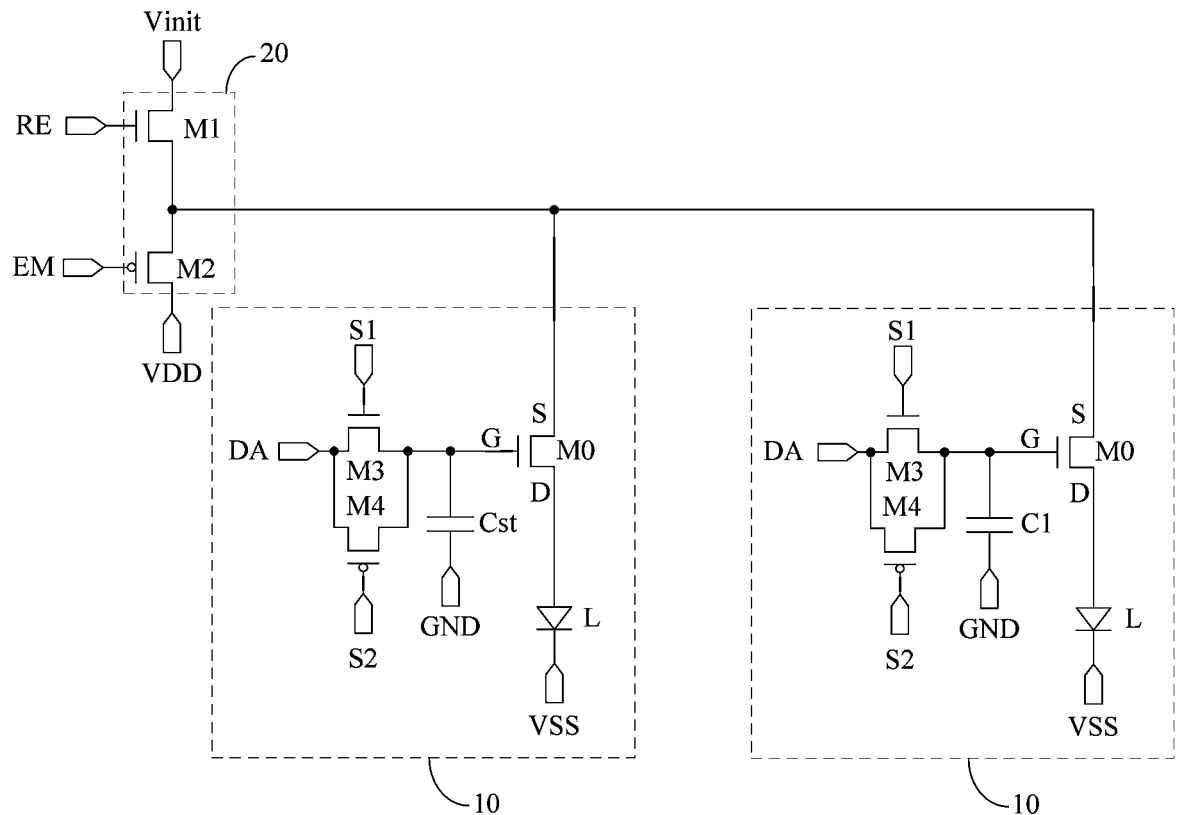
FIG. 6D is a circuit diagram of a specific implementation example of a voltage control circuit and a pixel circuit of a silicon-based organic light-emitting display panel provided by at least one embodiment of the present disclosure.
Figure 6E:
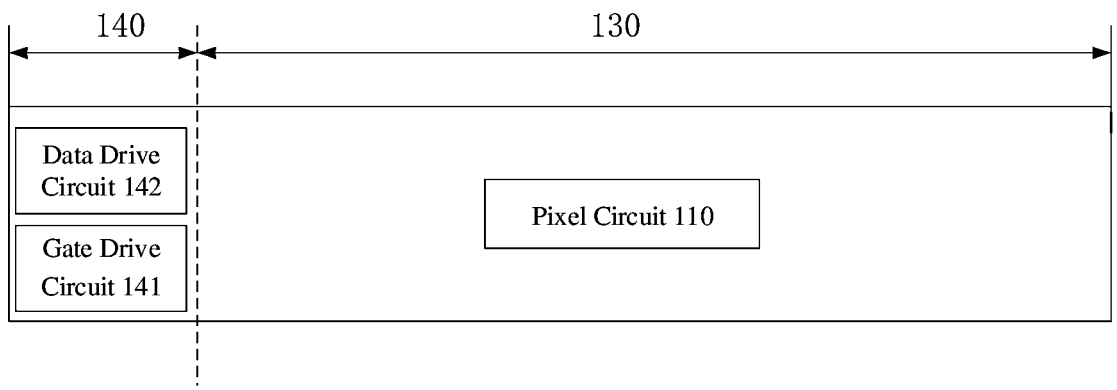
FIG. 6E is a schematic diagram of a silicon substrate provided by at least one embodiment of the present disclosure.

For example, in some examples, the silicon-based organic light-emitting display panel 10 comprises a silicon substrate (the silicon substrate 11 as illustrated in FIG. 6A), as illustrated in FIG. 6E, the silicon substrate 11 comprises a display area 130 and a periphery area 140 which surrounds the display area, the display area 130 comprises a plurality of display components for realizing display function. For example, the flexible circuit board 30 is connected to the display side of the silicon-based organic light-emitting display panel 10 (for example, an upper side of the silicon-based organic light-emitting display panel 10 as illustrated in FIG. 1, that is, the upper side of the silicon substrate 11 as illustrated in FIG. 6A, that is, the periphery area of the silicon substrate 140) and is bended along an edge of the silicon-based organic light-emitting display panel 10 (for example, a left edge of the silicon-based organic light-emitting display panel 10 as illustrated in FIG. 1). For example, according to demands, the flexible circuit board 30 may be bended for 180 degrees, so as to allow the flexible circuit board 30 to be at least partially at the side of the heat dissipation film layer 20 away from the silicon-based organic light-emitting display panel 10, such that the size of the display device can be decreased, and the requirement on the size of the display device in the case where the display device is implemented as a virtual reality device or an augmented reality device can be satisfied, this allows a terminal to have better matching performance.

For example, in some examples, the orthographic projection of the heat dissipation film layer 20 on the plane parallel to the silicon-based organic light-emitting display panel is within the orthographic projection of the silicon substrate of the silicon-based organic light-emitting display panel 10 on the plane parallel to the silicon-based organic light-emitting display panel; the orthographic projection of the heat dissipation film layer 20 on the plane parallel to the silicon-based organic light-emitting display panel at least partially overlaps an orthographic projection of the display area on the plane parallel to the silicon-based organic light-emitting display panel. It should be noted that, the descriptions of the display component and the silicon substrate can refer to the following detailed descriptions regarding the silicon-based organic light-emitting display panel in FIG. 6A and FIG. 6B, and no further descriptions will be given here.

For example, the portion, which is at the side of the heat dissipation film layer 20 away from the silicon-based organic light-emitting display panel 10, of the flexible circuit board may be wider than, narrower than, or have the same width as the silicon-based organic light-emitting display panel 10, the specific width may be set according to actual demands, and no limitation will be given in embodiments of the present disclosure in this respect. For example, the widths here are all the size along a direction parallel to the plane where the silicon-based organic light-emitting display panel is located.

Figure 3:
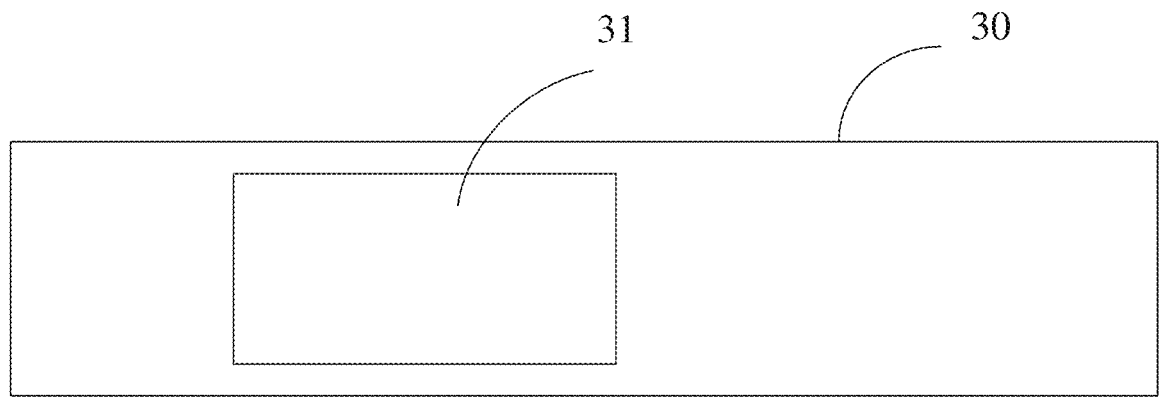
FIG. 3 is a schematic diagram of a through-hole of a flexible circuit board provided by at least one embodiment of the present disclosure.
Figure 4:
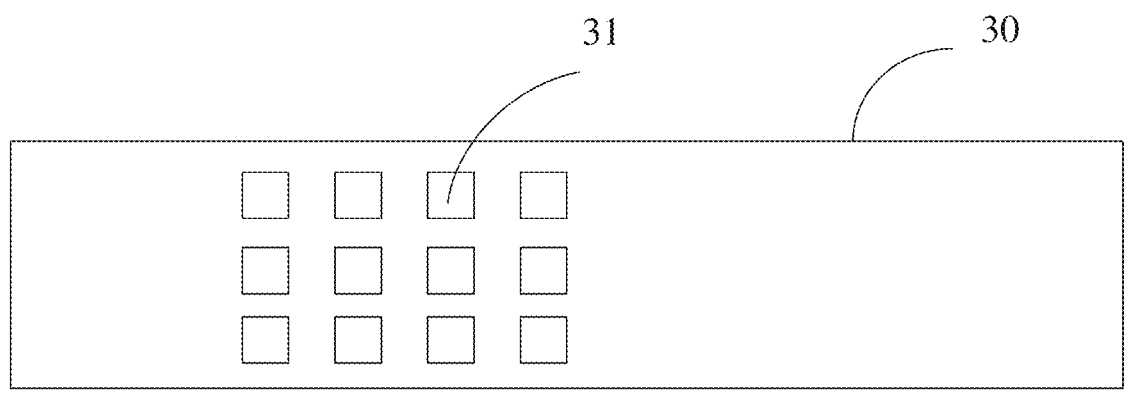
FIG. 4 is a schematic diagram of another through-hole of a flexible circuit board provided by at least one embodiment of the present disclosure.

For example, in some examples, as illustrated in FIG. 3 or FIG. 4, the flexible circuit board 30 may be provided with at least one through-hole 31. For example, an orthographic projection of the least one through-hole on the plane parallel to the silicon-based organic light-emitting display panel 10 at least partially overlaps the orthographic projection of the heat dissipation film layer on the plane parallel to the silicon-based organic light-emitting display panel, that is, the orthographic projection of the least one through-hole 31 on the plane parallel to the silicon-based organic light-emitting display panel is within the orthographic projection of the heat dissipation film layer 20 on the plane parallel to the silicon-based organic light-emitting display panel, such that the heat dissipation film layer can be exposed via the through-hole 31, so as to avoid the flexible circuit board 30 under the heat dissipation film layer 20 to stop the heat dissipation, and allow the heat generated during a light-emitting process of the silicon-based organic light-emitting display panel 10 to be sent out via the heat dissipation film layer 20 and the through-hole 31 of the flexible circuit board 30. For example, the heat can be sent out along a path D as illustrated in FIG. 2. By this way, effective heat transfer can be realized for the silicon-based OLED display component, the temperature of the silicon-based OLED display component can be decreased, the service life of the silicon-based OLED display component can be prolonged, and the display quality of the display device can be increased.

For example, in some examples, as illustrated in FIG. 3, the through-hole 31 may comprise a relatively large through-hole, which is corresponding to the position of the heat dissipation film layer 20 and the silicon-based organic light-emitting display panel 10. For example, in the case where the through-hole 31 is a relatively large through-hole, the portion, which is located at a position around the through-hole 31, of the flexible circuit board may be connected to the heat dissipation film layer 30. For example, in other examples, as illustrated in FIG. 4, the at least one through-hole 31 may comprise a plurality of through-holes, no limitation will be given in embodiments of the present disclosure regarding an amount of the through-holes. For example, no matter which through-hole in the through-hole in FIG. 3 and the through-hole in FIG. 4 is adopted, the orthographic projection of the through-hole 31 on the plane parallel to the silicon-based organic light-emitting display panel is within the orthographic projection of the heat dissipation film layer on the plane parallel to the silicon-based organic light-emitting display panel, such that the heat dissipation effect can be further improved.

For example, in some examples, the display device 1 further comprises a sealant 12 around a side surface of the cover plate 19, and is connected to the cover plate 19 and the silicon substrate 11. The spacing between the side surface of the cover plate 19 and the silicon substrate 11 is sealed through the sealant 12, such that the invasion of water and oxygen in air at outside can be blocked.

It should be noted that, a shape of the through-hole 31 may be regular shapes, such as a rectangle, an ellipse, a circle, a diamond, or other irregular shapes, as long as effective heat transfer can be realized, and no limitation will be given in embodiments of the present disclosure in this respect.

Figure 5:
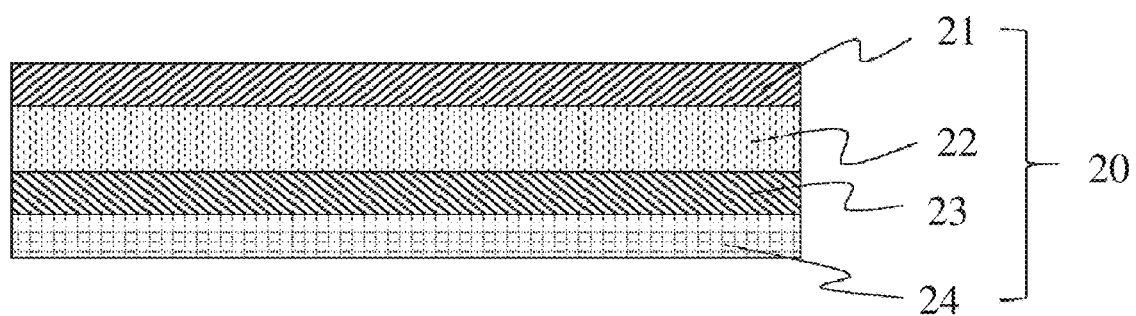
FIG. 5 is a cross-sectional view of a structure of a heat dissipation film layer provided by at least one embodiment of the present disclosure.

FIG. 5 is a cross-sectional view of a structure of a heat dissipation film layer provided by at least one embodiment of the present disclosure. As illustrated in FIG. 5, for example, in some examples, the heat dissipation film layer 20 may be directly formed on the silicon-based organic light-emitting display panel 10. For example, in the present example, the heat dissipation film layer 20 comprises a first adhesive film layer 24 and a first heat dissipation film layer 23. For example, the first adhesive film layer 24 is adhered onto the flexible circuit board 30; and the first heat dissipation film layer is between the first adhesive film layer 24 and the silicon-based organic light-emitting display panel 10.

For example, in the present example, the first heat dissipation film layer 23 may be directly formed on the silicon-based organic light-emitting display panel 10 by an evaporation process, and then the first heat dissipation film layer 23 is overlapped by the first adhesive film layer 24, so as to allow the heat dissipation film layer 20 to be adhered with the flexible circuit board 30 through the first adhesive film layer 24, and to guarantee the stability of the display device 1. For example, a material of the first adhesive film layer 24 may be an acrylic pressure-sensitive film or an organic material with adhesion, such as resin, and the embodiments of the present disclosure are not specifically limited thereto.

In embodiments of the present disclosure, the adoption of an evaporation process to form the first heat dissipation film layer 23 can reduce the manufacturing cost of the heat dissipation film layer, and allow the manufacturing process to be simple, such that the complexity of the manufacturing process of the display device can be lowered.

For example, a material of the first heat dissipation film layer 23 may be a metal. For example, the metal comprises copper, copper alloy, silver, silver alloy, aluminum or aluminum alloy, etc., and no limitation will be given in embodiments of the present disclosure in this respect. For example, in an example, the first heat dissipation film layer 23 may adopt a copper foil.

For example, in other examples, before the first heat dissipation film layer 23 is formed on the silicon-based organic light-emitting display panel 10 through the evaporation process, the second heat dissipation film layer 22 may be formed on the silicon-based organic light-emitting display panel 10 by electroforming method. For example, a material of the second heat dissipation film layer 22 comprises graphite or graphene, etc., so as to allow heat to be uniform, this is in favor of effective heat dissipation. For example, in some examples, the second heat dissipation film layer 22 may be formed by graphitization of high polymers, and no limitation will be given in embodiments of the present disclosure in this respect.

For example, in other examples, the heat dissipation film layer 20 may be separately formed, and then the heat dissipation film layer 20 may be adhered onto the silicon-based organic light-emitting display panel 10. For example, in this example, the heat dissipation film layer 20 further comprises a second adhesive film layer 21 at a side of the first heat dissipation film layer 24 closer to the silicon-based organic light-emitting display panel 10, and is adhered onto the silicon-based organic light-emitting display panel 10. For example, a material of the second adhesive film layer 21 and the material of the first adhesive film layer 24 may be the same or different. For example, the material of the second adhesive film layer 21 may be an acrylic pressure-sensitive film or an organic material with adhesion, such as resin, and no limitation will be given in embodiments of the present disclosure in this respect.

FIG. 6A is a schematic diagram of a silicon-based organic light-emitting display panel provided by at least one embodiment of the present disclosure. As illustrated in FIG. 6A, the silicon-based organic light-emitting display panel comprises: a silicon substrate 11, a first electrode 13 of a display component, an organic light-emitting layer 14, and a second electrode 15 of the display component.

For example, as illustrated in FIG. 6E, the silicon substrate 11 is integrated with a gate drive circuit 141, a data drive circuit 142 and a pixel circuit 110, the flexible circuit board 30 is configured to transmit electrical signals to the gate drive circuit 141, the data drive circuit 142, and the second electrode of the display component. For example, the gate drive circuit 141 is configured to generate drive signals, the data drive circuit 142 is configured to generate data signals, and the gate drive circuit 141 and the data drive circuit 142 may adopt circuit structure in in the field, and no limitation will be given in embodiments of the present disclosure in this respect. For example, the gate drive circuit 141 and the data drive circuit 142 is in the periphery area 140 of the silicon substrate, the pixel circuit 110 is in the display area 130 of the silicon substrate, and is connected to the display components on the silicon substrate.

For example, as illustrated in FIG. 6A, the first electrode 13 of the display component (not shown in figures) is on the silicon substrate 11, and is connected to the pixel circuit (not shown in figures) integrated on the silicon substrate 11; the organic light-emitting layer 14 is at a side of the first electrode 13 of the display component away from the silicon substrate 11; the second electrode 15 of the display component is at a side of the organic light-emitting layer 14 away from the first electrode 13 of the display component.

For example, the pixel circuit (not shown in figures) is configured to provide a drive current to the first electrode 13 of the display component under the control of drive signals, such as a gate scan signal, a data signal and a voltage signal, so as to allow the organic light-emitting layer 14 of the display component to emit light under an electric field between the first electrode 13 of the display component and the second electrode 15 of the display component. Specific descriptions of the pixel circuit may refer to the descriptions related to FIG. 6D in the following, and no further descriptions will be given here. It should be noted that, the pixel circuit as illustrated in FIG. 6D is only an example, and no limitation will be given in embodiments of the present disclosure in this respect. For example, the pixel circuit may also adopt a pixel circuit including a circuit structure of 4T1C, 4T2C, 7T1C, 8T2C in the field, and the driving method of the pixel circuit may adopt method in the field, and no further descriptions will be given here. For example, the pixel circuit may be formed on the silicon substrate 11 by CMOS process, and no limitation will be given in embodiments of the present disclosure in this respect.

For example, the display component is an OLED display component. For example, the first electrode 13 of the display component is an anode, the second electrode 15 of the display component is a cathode, which is, for example, grounded. For example, the first electrode 13 of the display component may be made of a material including transparent metal oxides, such as indium tin oxide (ITO) or indium zinc oxide (IZO), and the first electrode 13 has a relatively high light transmittance. For example, a material of the second electrode 15 of the display component is a metal, and the metal, for example, may be made of a material, such as magnesium, magnesium alloy, aluminum or aluminum alloy, etc.

For example, the organic light-emitting layer 14 may be made of an organic material, and may take advantage of the light-emitting characteristics of the organic material to emit light after being electrified.

For example, the silicon-based organic light-emitting display panel 10 further comprises a first film encapsulation layer 16, a second film encapsulation layer 18, a color film layer 17, and a cover plate 19. For example, the first film encapsulation layer 16 and the second film encapsulation layer 18 are sequentially provided at the side of the second electrode 15 of the display component away from the organic light-emitting layer 14; the color film layer 17 is between the first film encapsulation layer 16 and the second film encapsulation layer 18; the cover plate is at a side of the second film encapsulation layer 18 away from the color film layer 17.

For example, the first film encapsulation layer 16 and the second film encapsulation layer 18 may realize effective encapsulating of the display component, so as to effectively block water vapor, oxygen, etc., and to realize the aim of protecting the display component and prolonging the service life of the display component. For example, the color film layer 17 comprises RGB color film layers, which are respectively matched with the organic light-emitting layers 14, the color film layer 17 is above the first film encapsulation layer 16, and is corresponding to the organic light-emitting layer 14, so as to realize color display with the emitted light.

For example, the second film encapsulation layer 18 and the cover plate 19 are sequentially provided on the color film layer 17, and can realize the function of protecting the color film layer 17. For example, the second film encapsulation layer 18 is made of one or more of organic materials and inorganic materials with relatively good sealing characteristics, so as to achieve better sealing effect and protect the silicon-based OLED display component. For example, the cover plate 19 may adopt a transparent material, and the transparent material may be, for example, an inorganic material, such as glass or an organic material, such as polyimide. For example, in embodiments of the present disclosure, bare glass with high transmittance may be adopted, and no limitation will be given in embodiment of the present disclosure in this respect.

FIG. 6B is a cross-sectional view of part of a silicon-based organic light-emitting display panel provided by at least one embodiment of the present disclosure. The silicon-based organic light-emitting display panel in the present embodiment is basically the same as the silicon-based organic light-emitting display panel as illustrated in FIG. 6A, except that the structure of the silicon-based organic light-emitting display panel 10 in the present embodiment illustrates more details and a plurality of sub-pixels. It should be understood that, the silicon-based organic light-emitting display panel 10 in the present embodiment may be completely or basically the same as silicon-based organic light-emitting display panel 10 as illustrated in FIG. 6A, for the sake of clarity, detailed structure of the silicon-based organic light-emitting display panel 10 are not shown in FIG. 6A. Obviously, the silicon-based organic light-emitting display panel 10 in the present embodiment may be different from the silicon-based organic light-emitting display panel 10 as illustrated in FIG. 6A, as long as corresponding functions can be achieved. It should be understood that, the silicon-based organic light-emitting display panel as illustrated in FIG. 6A also comprises a plurality of sub-pixels, and the sub-pixels are not shown in FIG. 6A for the sake of clarity.

In the present embodiment, as illustrated in FIG. 6B, the silicon-based organic light-emitting display panel 10 comprises a silicon substrate 11 and a display component 410 (that is, a light-emitting element). For example, the silicon substrate 11 comprises a base substrate 420, a pixel circuit 110, a light reflective layer 440, and an insulation layer 450 which are sequentially stacked. The display component 410 comprises an anode layer 13 (that is, the first electrode of the display component), an organic light-emitting layer 14, and a cathode layer 15 (that is, the second electrode of the display component) which are sequentially stacked on the insulation layer 450. The anode layer 13 is a transparent electrode layer. For example, the insulation layer 450 allows light to be passed through, so as to allow the light emitted by the organic light-emitting layer 14 to pass through the insulation layer 450, and be incident on the light reflective layer 440, and be reflected by the light reflective layer 440.

For example, the insulation layer 450 comprises a via hole 452 which is filled with a metal component 451, the light reflective layer 440 is electrically connected to the anode layer 13 through the metal component 451. By this way, through forming a conductive channel between the light reflective layer 440 and the anode layer 13 in the insulation layer 450, the electrical signal provided by the pixel circuit 110 in the silicon substrate 11 is conducive to be transmitted to the anode layer 13 through the light reflective layer 440. This is not only in favor of realizing the control of the display component 410 by the pixel circuit 110, but also allows the structure of the silicon-based organic light-emitting display panel to be more compact, which is in favor of miniaturization of devices. Furthermore, for example, the metal component 451 is made of metal material, for example, tungsten metal; the via hole which is filled with tungsten metal is referred to as W-via. For example, in the case where a thickness of the insulation layer 450 is relatively large, forming of the W-via in the insulation layer 450 can guarantee the stability of the conductive path. Further, due to the mature manufacturing process of the w-via, a surface flatness of the obtained insulation layer 450 is good, this is in favor of reducing a contact resistance between the insulation layer 450 and the anode layer 13. It should be understood, the W-via is not only suitable for realizing the electrical connection between the insulation layer 450 and the anode layer 13, but also suitable for realizing the electrical connection between the light reflective layer 440 and the pixel circuit 110, and the electrical connection between other wire layers.

For example, the silicon substrate 11 comprises the pixel circuit 110, the pixel circuit 110, and the light reflective layer 440 are electrically connected, and the pixel circuit 110 is configured to drive the display component 410 to emit light. The pixel circuit 110 comprises at least a driving transistor M0 and a switching transistor (not shown in figures), the driving transistor M0 is electrically connected to the light reflective layer 440, such that the electrical signal for driving the display component 410 can be transmitted to the anode layer 13 via the light reflective layer 440, so as to control the display component 410 to emit light. For example, the driving transistor M0 comprises a gate electrode, a source electrode S, and a drain electrode D. The source electrode S of the driving transistor M0 is electrically connected to the light reflective layer 440. In the case where the driving transistor M0 is turned on, the electrical signal provided by a power wire can be transmitted to the anode layer 13 via the source electrode S of the driving transistor M0 and the light reflective layer 440. Because a voltage difference is formed between the anode layer 13 and the cathode layer 15, an electric field is formed between the anode layer 13 and the cathode layer 15, and thus the organic light-emitting layer 14 emits light under the electric field. It should be understood that, in the driving transistor M0, a position of the source electrode S and a position of the drain electrode D are interchangeable, and thus, it will work as long as either one of the source electrode S and the drain electrode D is electrically connected to the light reflective layer 440.

For example, the silicon-based organic light-emitting display panel 10 comprises a plurality of sub-pixels (or pixel unit). FIG. 6B illustratively illustrates three sub-pixels, that is, a red sub-pixel SP1, a green sub-pixel SP2 and a blue sub-pixel SP3. Each sub-pixel is corresponding to one sub-pixel region of the silicon-based organic light-emitting display panel 10, that is, each sub-pixel is provided with an independent display component 410 and a driving transistor M0.

For example, the insulation layers 450 in the three sub-pixels are integrated formed so as to facilitate production. For example, as illustrated in FIG. 6B, the insulation layer 450 further comprises an opening 454 for exposing a pad 453, and providing of the opening 454 is in favor of the electrical connection and signal connection between the pad 453 and an external circuit. For example, the opening 454 for the pad 453 is at the periphery area 140. Colors of the sub-pixels in the silicon-based organic light-emitting display panel 10 are only an example, and the colors of the sub-pixels in the silicon-based organic light-emitting display panel 10 may further comprise other colors, such as yellow, white, etc.

For example, as illustrated in FIG. 6B, the silicon-based organic light-emitting display panel 10 further comprises a first film encapsulation layer 16, a color film layer 17, and a second film encapsulation layer 18, that are sequentially provided on the cathode layer 15. The silicon-based organic light-emitting display panel 10 further comprises a cover plate 19, and the cover plate 19 is on the second film encapsulation layer 18. For example, the first film encapsulation layer 16 is at a side of the cathode layer 15 away from the base substrate 420. The color film layer 17 is at a side of the first film encapsulation layer 16 away from the base substrate 420, and comprises a red filter unit R, a green filter unit G and a blue filter unit B. The second film encapsulation layer 18 and the cover plate 19 are at a side of the color film layer 17 away from the base substrate 420. The specific materials of the first film encapsulation layer 16, the color film layer 17, the second film encapsulation layer 18 and the cover plate 19 may adopt materials in the field, and no further description will be given here.

For example, in the silicon-based organic light-emitting display panel 10 provided by embodiments of the present disclosure, the display component 410 including the anode layer 13, the organic light-emitting layer 14, and the cathode layer 15, the first film encapsulation layer 16, the color film layer 17, the second film encapsulation layer 18 and the cover plate 19 are all formed in a panel factory. In addition, the etching of the insulation layer 450 above the pad 453 is also accomplished in the panel factory, so as to expose the pad 453, and allows the pad 453 to be bonded with a flexible printed circuit (FPC bonding) or a wire (wire bonding). Therefore, in embodiments of the present disclosure, the silicon substrate 11 which includes the light reflective layer 440 and the insulation layer 450 and is suitable for forming the display component 430 may be formed by a wafer factory, this not only lowers the difficulty in forming the light reflective layer 440, but also in favor of subsequent processes in panel factory.

FIG. 6C is a schematic diagram illustrating the circuit principle of a silicon-based organic light-emitting display panel provided by at least one embodiment of the present disclosure. The silicon-based organic light-emitting display panel comprises a plurality of display components L in the display area 130 (AA region) and pixel circuits 110 which are coupled to the display components L according to one-to one correspondence, and the pixel circuit 110 comprises a driving transistor. Further, the silicon-based organic light-emitting display panel may further comprise a plurality of voltage control circuits 120 in the non-display area (an area of the silicon-based organic light-emitting display panel except the display area 130) of the silicon-based organic light-emitting display panel. For example, at least two pixel circuits 110 in one row share one the voltage control circuit 120, first electrodes of driving transistors of the pixel circuits 110 in one row is coupled with the shared voltage control circuit 120. Second electrodes of the driving transistors are coupled with corresponding display components L. The voltage control circuits 120 are configured to output initial signals Vinit to the first electrodes of the driving transistors in response to reset control signals RE, so as to control the reset corresponding display components L; the voltage control circuits 120 are further configured to output first power signals VDD to the first electrodes of the driving transistors in response to light-emitting control signals EM, so as to drive the display components L to emit light. Through sharing the voltage control circuits 120, the structures of the pixel circuits in the display area 130 can be simplified, and the area occupied by the pixel circuits in the display area 130 can be reduced, such that more pixel circuits and more display components can be provided in the display area 130, and the organic light display panel with high PPI can be realized. Further, the voltage control circuits 120 are configured to output the initial signals Vinit to the first electrodes of the driving transistors under the control of the reset control signals RE, so as to reset corresponding display components, such that adverse effect of the voltages applied to the display components during the light-emitting phase in a previous frame on the light-emitting phase in a next frame can be avoided and the image-retention phenomenon can be suppressed.

For example, the silicon-based organic light-emitting display panel may further comprise a plurality of pixel units PX in the display area 130, and each pixel unit PX comprises a plurality of sub-pixels; the sub-pixels respectively comprise one display component L and one pixel circuit 110. Further, the pixel unit PX may comprise three sub-pixels of different color. The above three sub-pixels are respectively a red sub-pixel, a green sub-pixel, and a blue sub-pixel. Obviously, the pixel unit PX may comprise four, five or more sub-pixels, this can be determined and designed according practical application environment, and no limitation will be given in this respect.

For example, the pixel circuits 110 of at least two sub-pixels that are adjacent with each other and in the same row may share one voltage control circuit 120. For example, in some examples, as illustrated in FIG. 6C, all of the pixel circuits 110 in the same row may be allowed to share one voltage control circuit 120. Alternatively, in other example, adjacent two, three or more pixel circuits 110 in the same row may be allowed to share one voltage control circuit 120, and no limitation will be given in this respect. By this way, the area occupied by the pixel circuits in the display area 130 can be reduced by sharing the voltage control circuit 120.

FIG. 6D is a circuit diagram of a specific implementation example of a voltage control circuit and a pixel circuit of a silicon-based organic light-emitting display panel provided by at least one embodiment of the present disclosure. For example, the driving transistor M0 in the pixel circuit 110 may be an N type transistor, in the case where current flows from a first terminal S of the driving transistor M0 to a second terminal D of the driving transistor M0, the first terminal S of the driving transistor M0 can serve as the source electrode of the driving transistor M0, and the second terminal D of the driving transistor M0 can serve as the drain electrode of the driving transistor M0; in the case where current flows from the second terminal D of the driving transistor M0 to the first terminal S of the driving transistor M0, the second terminal D of the driving transistor M0 can serve as the source electrode of the driving transistor M0, and the first terminal S of the driving transistor M0 can serve as the drain electrode of the driving transistor M0. Further, the display component L may comprise an OLED. In this case, a positive electrode of the OLED is electrically connected to the second terminal D of the driving transistor M0; a negative electrode of the OLED is electrically connected to a second power supply terminal VSS. A voltage of the second power supply terminal VSS is commonly a negative voltage or a grounded voltage VGND (is commonly 0V), a voltage of the initial signal Vinit may be set to be grounded voltage VGND, and no limitation will be given in this respect. For example, the OLED may be set to be a micro-OLED or a mini-OLED, this is in favor of realizing an organic light display panel with high PPI.

For example, descriptions are given by taking the case where each row comprises two pixel circuits 110 as an example, the voltage control circuit 120 may comprise a first switching transistor M1 and a second switching transistor M2. A gate electrode of the first switching transistor M1 is configured to receive a reset control signal RE, a first electrode of the first switching transistor M1 is configured to receive an initial signal Vinit, and a second electrode of the first switching transistor M1 is coupled with the first electrodes S of a corresponding driving transistor M0. A gate electrode of the second switching transistor M2 is configured to receive a light-emitting control signal EM, a first electrode of the second switching transistor M2 is configured to receive a first power signal VDD, a second electrode of the second switching transistor M2 is coupled with the first electrode S of the corresponding driving transistors M0.

For example, the types of the first switching transistor M1 and the second switching transistor M2 may be allowed to be different. For example, the first switching transistor M1 is an N type transistor, and the second switching transistor M2 is a P type transistor; alternatively, the first switching transistor M1 is a P type transistor, and the second switching transistor M2 is an N type transistor. Obviously, the types of the first switching transistor M1 and the second switching transistor M2 may be allowed to be the same. In practical application, the types of the first switching transistor M1 and the second switching transistor M2 may be designed according to actual application environment, and no limitation will be given in this respect.

For example, the pixel circuit 110 may further comprise a third switching transistor M3 and a storage capacitor Cst. For example, a gate electrode of the third switching transistor M3 is configured to receive a first gate scan signal 51, a first electrode of the third switching transistor M3 is configured to receive a data signal DA, a second electrode of the third switching transistor M3 is coupled with the gate electrode G of the driving transistor M0. A first terminal of the storage capacitor Cst is coupled with the gate electrode G of the driving transistor M0, and a second terminal of the storage capacitor Cst is coupled with a ground terminal GND.

For example, the pixel circuit 110 may further comprise a fourth switching transistor M4. For example, a gate electrode of the fourth switching transistor M4 is configured to receive a second gate scan signal S2, a first electrode of the fourth switching transistor M4 is configured to receive the data signal DA, a second electrode of the fourth switching transistor M4 is coupled with the gate electrode G of the driving transistor M0. Further, the types of the fourth switching transistor M4 and the third switching transistor M3 are different. For example, the third switching transistor M3 is an N type transistor, and the fourth switching transistor M4 is a P type transistor; alternatively, the third switching transistor M3 is a P type transistor, and the fourth switching transistor M4 is an N type transistor.

It should be noted that, in the case where the voltage of the data signal DA is a voltage corresponding to a high grey scale, the data signal DA is transmitted to the gate electrode G of the driving transistor M0 through turning on the fourth switching transistor M4 of, for example, P type, such that adverse effect of a threshold voltage of the third switching transistor M3 of, for example, N type on a voltage of the data signal DA can be avoided. In the case where the voltage of the data signal DA is a voltage corresponding to a low grey scale, the data signal DA is transmitted to the gate electrode G of the driving transistor M0 through turning on the third switching transistor M3 of, for example, N type, such that adverse effect of the threshold voltage of the fourth switching transistor M4 of, for example, P type on the voltage of the data signal DA can be avoided. By this way, a range of the voltage applied on the gate electrode G of the driving transistor M0 can be improved.

Figure 7:
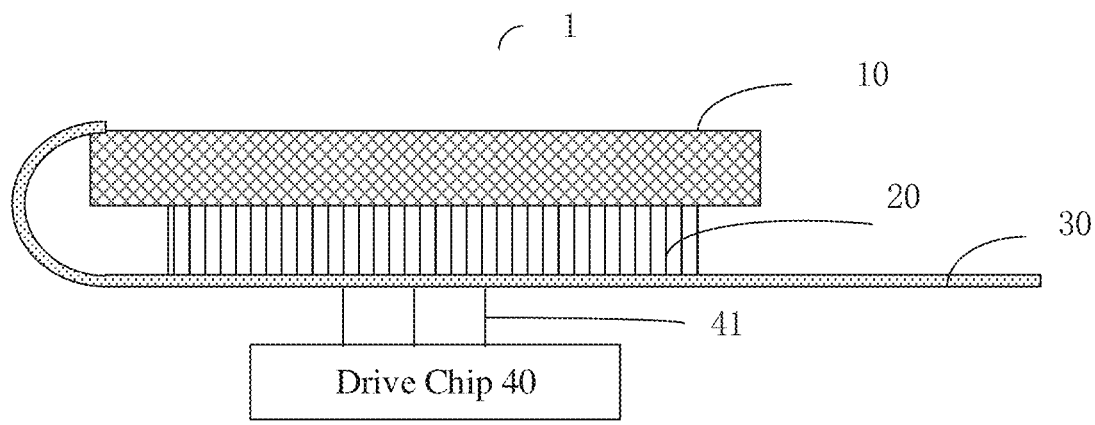
FIG. 7 is a cross-sectional view of another display device provided by at least one embodiment of the present disclosure.

FIG. 7 is a cross-sectional view of another display device provided by at least one embodiment of the present disclosure. As illustrated in FIG. 7, on the basis of the example as illustrated in FIG. 1, the display device 1 further comprises a drive circuit 40. For example, the drive circuit 40 is connected to the flexible circuit board 30, and is configured to provide a drive signal to the silicon-based organic light-emitting display panel 10. For example, the drive circuit 40 is in a bonding region of the display device 1, and is connected to the flexible circuit board 30 via a signal line 41, so as to through the flexible circuit board 30, provide drive signals (for example, a clock signal, an initial signal Vinit, a first power signal VDD, a second power signal VSS, image data, etc.) respectively to the gate drive circuit, the data drive circuit and the pixel circuit and so on in the silicon-based OLED display substrate.

It should be noted that, for the sake of clarity and conciseness, embodiments of the present disclosure do not illustrate all components of the display device. In order to realize the basic functions of the display device, those skilled in the art may provide other structures that are not illustrated according to specific needs, and no limitation will be given in embodiments of the present disclosure in this respect.

For the display device provided in the above embodiments of the present disclosure, on the one hand, the display device realizes the heat dissipation of the silicon-based organic light-emitting display panel through adopting the heat dissipation film layer, such that the adverse effect of the temperature change of the silicon-based organic light-emitting diode in the silicon-based organic light-emitting display panel caused by the heat dissipation issue on the display brightness and display life time of the display device is avoided, the display quality of the display device is improved, and the service life of the display device is prolonged. On the other hand, the display device allows the heat dissipation film layer to be integrated with the silicon-based OLED display substrate, this allows the manufacturing process to be simple, improves the compactness of the display device, and significantly reduces the manufacturing cost of the display device.

Figure 8:
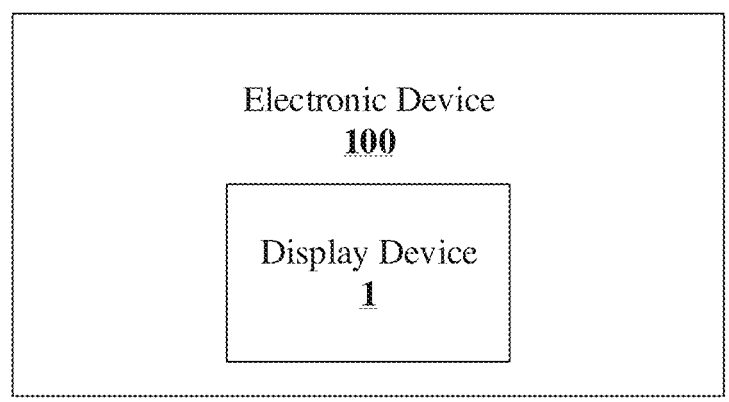
FIG. 8 is a schematic diagram of an electronic device provided by at least one embodiment of the present disclosure.

At least one embodiment of the present disclosure further provides an electronic device. FIG. 8 is a schematic diagram of an electronic device provided by at least one embodiment of the present disclosure. As illustrated in FIG. 8, the electronic device 100 comprises a display device 1 provided by any one of the embodiments of the present disclosure. For example, the electronic device 100 comprises the display device 1 as illustrated in FIG. 1 or FIG. 7. For example, the electronic device 100 may be a virtual reality device or an augmented reality device.

For example, the display device 1 may be a silicon-based OLED display device, and no limitation will be given in embodiments of the present disclosure in this respect.

It should be noted that, for the sake of clarity and conciseness, embodiments of the present disclosure do not illustrate all components of the electronic device 100. In order to realize the basic functions of the electronic device 100, those skilled in the art may provide other structures that are not illustrated according to specific needs, and no limitation will be given in embodiments of the present disclosure in this respect.

The technical effect of the electronic device 100 provided by the above embodiments may refer to the technical effect of the display device provided by embodiments of the present disclosure, and no further descriptions will be given.

Figure 9:
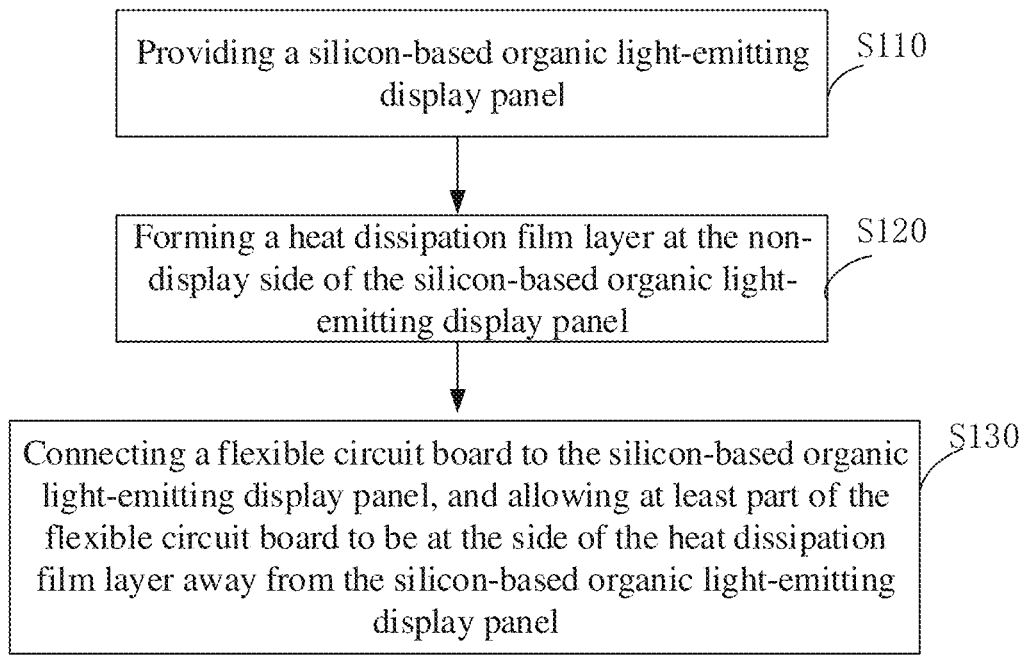
FIG. 9 is a flow chart of a manufacturing method of a display device provided by at least one embodiment of the present disclosure.

At least one embodiment of the present disclosure further provides a manufacturing method of a display device. FIG. 9 illustrates a flow chart of a manufacturing method of a display device provided by at least one embodiment of the present disclosure. For example, the manufacturing method can be used to manufacture the display device provided by any one of the embodiments of the present disclosure. For example, the manufacturing method can be used to manufacture the display substrate as illustrated in FIG. 1. As illustrated in FIG. 9, the manufacturing method of the display device comprises steps S110 to S130.

Step S110: providing a silicon-based organic light-emitting display panel.

Step S120: forming a heat dissipation film layer at the non-display side of the silicon-based organic light-emitting display panel.

Step S130: connecting the flexible circuit board to the silicon-based organic light-emitting display panel, and allowing at least part of the flexible circuit board to be at the side of the heat dissipation film layer away from the silicon-based organic light-emitting display panel.

It should be noted that, providing of the silicon-based organic light-emitting display panel in the step S110, is the step of forming organic light-emitting devices or other necessary display elements for display on one side of the silicon substrate. However, no specific limitation will be given regarding the order of the step of forming the organic light-emitting devices or other necessary display elements for display and the step of forming the heat dissipation film layer in the step S120; according to the actual situation, one of the following two execution orders can be chosen: forming the organic light-emitting devices or other necessary display elements for display first, and then forming the heat dissipation film layer; forming the heat dissipation film layer on the silicon substrate first, and then forming the organic light-emitting devices or other necessary display elements for display.

For the step S110, for example, the silicon-based organic light-emitting display panel 10 may adopt the structure as illustrated in FIG. 6A, and the structure can be formed by adopting method in the field, no further descriptions will be given here. And no limitation will be given in embodiments of the present disclosure in this respect.

For the step S120, for example, in an example, the heat dissipation film layer 20 may be directly formed at the non-display side of the silicon-based organic light-emitting display panel 10 according to specific manufacturing processes. In other examples, the heat dissipation film layer 20 may be separately formed first, and then the heat dissipation film layer 20 may be adhered onto the non-display side of the silicon-based organic light-emitting display panel 10. By providing the heat dissipation film layer 20 at the non-display side of the silicon-based organic light-emitting display panel, the heat can be effectively transferred outward, and effective heat transfer can be realized.

For example, in some examples, the orthographic projection of the heat dissipation film layer 20 on the plane parallel to the silicon-based organic light-emitting display panel 10 is within the orthographic projection of the silicon-based organic light-emitting display panel 10 on the plane parallel to the silicon-based organic light-emitting display panel. For example, the position of the heat dissipation film layer 20 is corresponding to the silicon-based organic light-emitting display panel 10, and the heat dissipation film layer 20 is integrated or attached under the silicon-based organic light-emitting display panel 10, such that effective heat dissipation of the silicon-based organic light-emitting display panel 10 can be realized. For example, the size of the heat dissipation film layer 20 is slightly smaller than the size of the silicon-based organic light-emitting display panel 10, such that adversely effect of the heat dissipation film layer 20 with a larger size on the size of the display device 1 and limitation on application scenario of the display device 1 can be avoided. In embodiments of the present disclosure, the volume of the heat dissipation film layer 20 is small, the heat dissipation effect is good, the service life of a silicon-based OLED display component can be prolonged, and the optical performance of high quality display can be achieved.

For example, in some examples, the step S120 comprises: forming a second heat dissipation film layer 22 at the non-display side of the silicon-based organic light-emitting display panel 10 by an electroforming method; forming a first heat dissipation film layer 23 on the second heat dissipation film layer 22 through an evaporation process; forming a first adhesive film layer 24 on the first heat dissipation film layer 23.

In embodiments of the present disclosure, by adopting an evaporation process to form the first heat dissipation film layer 23 and adopting an electroforming method to form the second heat dissipation film layer 22, the manufacturing cost of the heat dissipation film layer can be reduced, the manufacturing process can be allowed to be simple, and the complexity of the manufacturing process of the display device can be reduced.

For example, in other examples, in the case where the heat dissipation film layer 20 is separately formed, the step S120 may further comprise: before forming the second heat dissipation film layer 20, forming a second adhesive film layer 21, which is adhered onto the non-display side of the silicon-based organic light-emitting display panel 10.

For example, the first adhesive film layer is adhered onto the flexible circuit board 30. For example, the material of the first adhesive film layer 24 may be an acrylic pressure-sensitive film or an organic material with adhesion, such as resin, and no limitation will be given in embodiments of the present disclosure in this respect. For example, the material of the second adhesive film layer 21 and the material of the first adhesive film layer 24 may be the same or different. For example, the material of the second adhesive film layer 21 may be an acrylic pressure-sensitive film or an organic material with adhesion, such as resin, and no limitation will be given in embodiments of the present disclosure in this respect.

For example, the material of the first heat dissipation film layer 23 may be a metal. For example, the metal comprises copper, copper alloy, silver, silver alloy, aluminum or aluminum alloy, etc., and no limitation will be given in embodiments of the present disclosure in this respect. For example, in an example, the first heat dissipation film layer 23 may adopt a copper foil. For example, the material of the second heat dissipation film layer 22 comprises graphite or graphene, etc., so as to allow heat to be uniform, this is in favor of effective heat dissipation.

For the step S130, for example, the flexible circuit board 30 is connected to the display side of the silicon-based organic light-emitting display panel 10 (for example, is connected to the pixel circuit in the silicon-based organic light-emitting display panel 10), and is bended along the edge of the silicon-based organic light-emitting display panel 10 (for example, the left edge of the silicon-based organic light-emitting display panel 10 as illustrated in FIG. 1), so as to allow at least part of the flexible circuit board 30 to be at the side of the heat dissipation film layer 20 away from the silicon-based organic light-emitting display panel 10. For example, according to demands, the flexible circuit board 30 may be bended for 180 degrees, so as to reduce the size of the display device.

For example, the manufacturing method may further comprise: forming at least one through-hole on the flexible circuit board 30; for example, forming the through-hole as illustrated in FIG. 3 or FIG. 4. For example, the orthographic projection of the least one through-hole on the plane parallel to the silicon-based organic light-emitting display panel 10 at least partially overlaps the orthographic projection of the heat dissipation film layer on the plane parallel to the silicon-based organic light-emitting display panel, such that the heat dissipation film layer can be exposed via the through-hole 31, so as to avoid the flexible circuit board 30 under the heat dissipation film layer 20 to stop the heat dissipation, and allow the heat generated during the light-emitting process of the silicon-based organic light-emitting display panel 10 to be sent out via the heat dissipation film layer 20 and the through-hole 31 of the flexible circuit board 30. For example, the heat can be sent out along the path D as illustrated in FIG. 2. By this way, effective heat transfer can be realized for the silicon-based OLED display component, the temperature of the silicon-based OLED display component can be decreased, the service life of the silicon-based OLED display component can be prolonged, and the display quality of the display device can be increased.

For example, in some examples, as illustrated in FIG. 3, the through-hole 31 may comprise a relatively large through-hole, which is corresponding to the position of the heat dissipation film layer 20 and the silicon-based organic light-emitting display panel 10. For example, in the case where the through-hole 31 is a relatively large through-hole, the portion, which is located at the position around the through-hole 31, of the flexible circuit board may be connected to the heat dissipation film layer 30. For example, in other examples, as illustrated in FIG. 4, the at least one through-hole 31 may comprise a plurality of through-holes, no limitation will be given in embodiments of the present disclosure regarding the number of the through-holes. For example, no matter which through-hole in the through-hole in FIG. 3 and the through-hole in FIG. 4 is adopted, the orthographic projection of the through-hole 31 on the plane parallel to the silicon-based organic light-emitting display panel is within the orthographic projection of the heat dissipation film layer on the plane parallel to the silicon-based organic light-emitting display panel, such that the heat dissipation effect can be further improved.

It should be noted that, the shape of the through-hole 31 may be regular shapes, such as a rectangle, an ellipse, a circle, a diamond or other irregular shapes, as long as effective heat transfer can be realized, and no limitation will be given in embodiments of the present disclosure in this respect.

It should be noted that, in the plurality of embodiments of the present disclosure, the processes of the manufacturing method of the display device may comprise more operations or less operations, and the operations may be executed sequentially or in parallel. Even though the manufacturing method described above comprises a plurality of operations that are performed in a particular order, but it should be understood that the order of the plurality of operations is not limited. The above manufacturing method may be executed for once, and may also be executed for a plurality of times according to a predetermined condition.

The technical effect of the manufacturing method of the display device provided by the above embodiments may refer to the technical effect of the display device provided by embodiment of the present disclosure, and no further descriptions will be given.

The following statements should be noted:

(1) The accompanying drawings involve only the structure(s) in connection with the embodiment(s) of the present disclosure, and other structure(s) can be referred to common design(s).

(2) In case of no conflict, embodiments of the present disclosure and features in the embodiments of the present disclosure can be combined to obtain new embodiments.

What are described above is related to the illustrative embodiments of the disclosure only and not limitative to the scope of the disclosure; the scopes of the disclosure are defined by the accompanying claims.

What is claimed is:

1. A display device, comprising:
   a silicon-based organic light-emitting display panel comprising a silicon substrate, a first electrode of a display component, an organic light-emitting layer, and a second electrode of the display component, which are stacked sequentially;
   a heat dissipation film layer at a non-display side of the silicon-based organic light-emitting display panel; and
   a flexible circuit board which is at least partially at a side of the heat dissipation film layer away from the silicon-based organic light-emitting display panel, and is electrically connected to the silicon-based organic light-emitting display panel,
   wherein the silicon substrate is integrated with a gate drive circuit, a data drive circuit, and a pixel circuit, and the flexible circuit board is configured to transmit electrical signals to the gate drive circuit, the data drive circuit, and the second electrode of the display component, and
   wherein the flexible circuit board is provided with at least one through-hole, and an orthographic projection of the at least one through-hole on a plane parallel to the silicon-based organic light-emitting display panel at least partially overlaps an orthographic projection of the heat dissipation film layer on the plane parallel to the silicon-based organic light-emitting display panel.

2. The display device according to claim 1, wherein the orthographic projection of the least one through-hole on the plane parallel to the silicon-based organic light-emitting display panel is within the orthographic projection of the heat dissipation film layer on the plane parallel to the silicon-based organic light-emitting display panel.

3. The display device according to claim 1, wherein the silicon substrate comprises a display area and a periphery area which surrounds the display area, and the display component is in the display area; and
   the flexible circuit board is connected to the periphery area of the silicon substrate, and is bended along an edge of the silicon substrate, so as to allow at least part of the flexible circuit board is at the side of the heat dissipation film layer away from the silicon-based organic light-emitting display panel.

4. The display device according to claim 3, wherein an orthographic projection of the heat dissipation film layer on a plane parallel to the silicon-based organic light-emitting display panel at least partially overlaps an orthographic projection of the display area on the plane parallel to the silicon-based organic light-emitting display panel; and the orthographic projection of the heat dissipation film layer on the plane parallel to the silicon-based organic light-emitting display panel is within an orthographic projection of the silicon substrate on the plane parallel to the silicon-based organic light-emitting display panel.

5. The display device according to claim 1, wherein an orthographic projection of the heat dissipation film layer on a plane parallel to the silicon-based organic light-emitting display panel is within an orthographic projection of the silicon-based organic light-emitting display panel on the plane parallel to the silicon-based organic light-emitting display panel.

6. The display device according to claim 1, wherein the heat dissipation film layer comprises:
 a first adhesive film layer adhered onto the flexible circuit board; and
 a first heat dissipation film layer between the first adhesive film layer and the silicon substrate.

7. The display device according to claim 6, wherein the heat dissipation film layer further comprises: a second heat dissipation film layer between the first heat dissipation film layer and the silicon substrate.

8. The display device according to claim 7, wherein a material of the second heat dissipation film layer comprises graphite or graphene.

9. The display device according to claim 6, wherein the heat dissipation film layer further comprises: a second adhesive film layer which is at a side of the first heat dissipation film layer closer to the silicon substrate, and is adhered onto the silicon-based organic light-emitting display panel.

10. The display device according to claim 9, wherein a material of the first adhesive film layer and a material of the second adhesive film layer comprise an acrylic pressure-sensitive film.

11. The display device according to claim 1, wherein a material of the first heat dissipation film layer is a metal.

12. The display device according to claim 11, wherein the metal comprises copper, copper alloy, silver, silver alloy, aluminum or aluminum alloy.

13. The display device according to claim 1, wherein the silicon-based organic light-emitting display panel further comprises:
 a first film encapsulation layer and a second film encapsulation layer, which are sequentially provided at a side of the second electrode of the display component away from the organic light-emitting layer;
 a color film layer between the first film encapsulation layer and the second film encapsulation layer; and
 a cover plate at a side of the second film encapsulation layer away from the color film layer.

14. The display device according to claim 1, further comprising a drive circuit, wherein the drive circuit is connected to the flexible circuit board, and is configured to provide drive signals to the silicon-based organic light-emitting display panel.

15. An electronic device, comprising the display device according to claim 1, wherein the electronic device is a virtual reality device or an augmented reality device.

16. A manufacturing method of a display device, comprising:
 providing a silicon-based organic light-emitting display panel;
 forming a heat dissipation film layer at a non-display side of the silicon-based organic light-emitting display panel;
 connecting a flexible circuit board to the silicon-based organic light-emitting display panel, and allowing at least part of the flexible circuit board to be at a side of the heat dissipation film layer away from the silicon-based organic light-emitting display panel; and
 forming at least one through-hole in the flexible circuit board, wherein an orthographic projection of the least one through-hole on a plane parallel to the silicon-based organic light-emitting display panel at least partially overlaps an orthographic projection of the heat dissipation film layer on the plane parallel to the silicon-based organic light-emitting display panel.

17. The manufacturing method of the display device according to claim 16, wherein connecting the flexible circuit board to the silicon-based organic light-emitting display panel, and allowing at least part of the flexible circuit board to be at the side of the heat dissipation film layer away from the silicon-based organic light-emitting display panel comprises:
 connecting the flexible circuit board to a display side of the silicon-based organic light-emitting display panel, and bending the flexible circuit board along an edge of the silicon-based organic light-emitting display panel, so as to allow at least part of the flexible circuit board to be at the side of the heat dissipation film layer away from the silicon-based organic light-emitting display panel.

18. The manufacturing method of the display device according to claim 16, wherein forming the heat dissipation film layer at the non-display side of the silicon-based organic light-emitting display panel, comprises:
 forming a first adhesive film layer;
 forming a first heat dissipation film layer on the first adhesive film layer by an evaporation process; and
 forming a second heat dissipation film layer on the first heat dissipation film layer by an evaporation process.

* * * * *